US011737335B2

(12) United States Patent
Yoon et al.

(10) Patent No.: US 11,737,335 B2
(45) Date of Patent: Aug. 22, 2023

(54) DISPLAY APPARATUS AND METHOD OF MANUFACTURING THE SAME

(71) Applicant: Samsung Display Co., Ltd., Yongin-si (KR)

(72) Inventors: Hyungguen Yoon, Yongin-si (KR); Kyuwon Jo, Yongin-si (KR); Sukhoon Kang, Yongin-si (KR); Beomsoo Shin, Yongin-si (KR); Sunghwan Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 293 days.

(21) Appl. No.: 17/231,928

(22) Filed: Apr. 15, 2021

(65) Prior Publication Data
US 2022/0052119 A1    Feb. 17, 2022

(30) Foreign Application Priority Data

Aug. 14, 2020  (KR) .................... 10-2020-0102705

(51) Int. Cl.
*H10K 59/38*  (2023.01)
*H10K 50/854*  (2023.01)
(Continued)

(52) U.S. Cl.
CPC ........... *H10K 59/38* (2023.02); *H10K 50/854* (2023.02); *H10K 50/865* (2023.02); *H10K 71/00* (2023.02);
(Continued)

(58) Field of Classification Search
CPC ...... H10K 59/38; H10K 59/121; H10K 59/12; H10K 59/35; H10K 59/1201;
(Continued)

(56) References Cited

U.S. PATENT DOCUMENTS 9,575,228 B2   2/2017  Kim et al.
10,361,259 B2  7/2019  Choi et al.
(Continued)

FOREIGN PATENT DOCUMENTS

JP   2006-310137 A   11/2006
JP   2010-073525 A    4/2010
(Continued)

*Primary Examiner* — Anne M Hines
*Assistant Examiner* — Jose M Diaz
(74) *Attorney, Agent, or Firm* — Lewis Roca Rothgerber Christie LLP

(57) ABSTRACT

A display apparatus includes: a first to third light-emitting element, each including an emission layer to emit light in a first direction, an encapsulation layer covering the first to third light-emitting elements; a first light-shielding layer arranged on the encapsulation layer, the first light-shielding layer including a first set of opening portions respectively corresponding to the first to third light-emitting elements; a metal layer arranged on an inner surface defining the first set of opening portions, wherein a width of the metal layer in a second direction normal (or perpendicular) to the first direction gradually decreases along the first direction; and a first color conversion layer; a second color conversion layer; and a light-transmitting layer, the first color conversion layer, the second color conversion layer, and a light-transmitting layer respectively corresponding to the first to third light-emitting elements.

21 Claims, 15 Drawing Sheets

(51) Int. Cl.
    *H10K 50/86*   (2023.01)
    *H10K 71/00*   (2023.01)
    *H10K 59/12*   (2023.01)
    *H10K 102/00*  (2023.01)

(52) U.S. Cl.
    CPC ... *H10K 59/1201* (2023.02); *H10K 2102/331* (2023.02)

(58) Field of Classification Search
    CPC .... H10K 50/854; H10K 50/865; H10K 50/84; H10K 50/86; H10K 50/85; H10K 50/856; H10K 71/00; H10K 2102/331
    See application file for complete search history.

(56) References Cited

U.S. PATENT DOCUMENTS

| | | | |
|---|---|---|---|
| 2012/0087107 A1* | 4/2012 | Kunimasa | G02F 1/133617 362/84 |
| 2019/0018286 A1 | 1/2019 | Kim et al. | |
| 2021/0336224 A1* | 10/2021 | Yun | H10K 71/00 |
| 2021/0408126 A1* | 12/2021 | Li | G02B 5/201 |

FOREIGN PATENT DOCUMENTS

| | | |
|---|---|---|
| JP | 2017-156412 A | 9/2017 |
| KR | 10-0978200 B1 | 8/2010 |
| KR | 10-2018-0018969 A | 2/2018 |
| KR | 10-2019-0008493 A | 1/2019 |

* cited by examiner

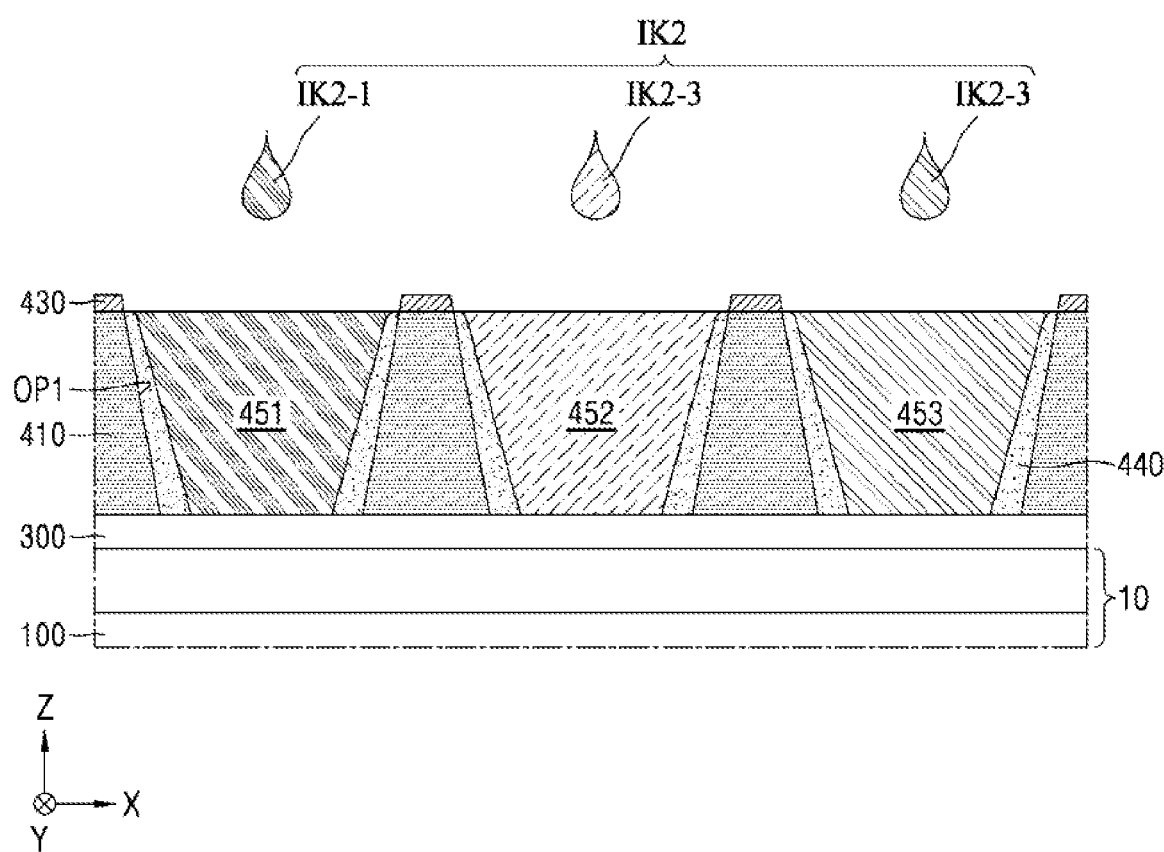

DISPLAY APPARATUS AND METHOD OF MANUFACTURING THE SAME

CROSS-REFERENCE TO RELATED APPLICATION

This application claims priority to and the benefit of Korean Patent Application No. 10-2020-0102705, filed on Aug. 14, 2020, in the Korean Intellectual Property Office, the entire content of which is incorporated herein by reference.

BACKGROUND

1. Field

One or more aspects of embodiments of the present disclosure relate to a display apparatus and a method of manufacturing the display apparatus, and for example, to a display apparatus with improved display quality and a method of manufacturing the display apparatus.

2. Description of Related Art

As various electronic apparatuses (such as mobile phones, personal digital assistants (PDAs), computers, and/or or large-sized televisions (TVs) have been developed, various types (or kinds) of display apparatuses applicable thereto have also been developed. For example, liquid crystal display apparatuses including a backlight unit and organic light-emitting display apparatuses that emit light of different colors in each color area have been widely used in the market. Recently, display apparatuses including a quantum dot color conversion layer (QD-CCL) have been developed. Quantum dots are excited by incident light to emit light having a wavelength longer than that of the incident light, and the incident light may generally have a relatively low wavelength.

SUMMARY

One or more aspects of embodiments of the present disclosure are directed toward a display apparatus having improved display quality by improving luminance and light conversion efficiency while preventing or reducing color mixing between pixels, and a method of manufacturing the display apparatus. However, such an aspect or technical problem is an example, and the disclosure is not limited thereto.

Additional aspects will be set forth in part in the description which follows and, in part, will be apparent from the description, or may be learned by practice of the presented embodiments of the disclosure.

One or more embodiments of the present disclosure provide a display apparatus including a first light-emitting element, a second light-emitting element, and a third light-emitting element, each including an emission layer to emit light of a first color in a first direction; an encapsulation layer covering the first to third light-emitting elements; a first light-shielding layer arranged on the encapsulation layer, the first light-shielding layer including a first set of opening portions respectively corresponding to the first to third light-emitting elements, a metal layer arranged on an inner surface of the first light-shielding layer defining the first set of opening portions, wherein a width of the metal layer in a second direction normal (or perpendicular) to the first direction gradually decreases along the first direction, a first color conversion layer arranged in a first opening portion of the first set of opening portions, corresponding to the first light-emitting element; a second color conversion layer arranged in a second opening portion of the first set of opening portions, corresponding to the second light-emitting element; and a light-transmitting layer arranged in a third opening portion of the first set of opening portions, corresponding to the third light-emitting element.

The display apparatus may further include a liquid repellent layer on the first light-shielding layer between the first, second, and third opening portions of the first set of opening portions on a plane.

The thickness of the metal layer may be less than about 2 µm.

The metal layer may include titanium oxide ($TiO_2$) or silver (Ag) nanoparticles.

The metal layer may include a polymer.

The polymer of the metal layer may include a condensation polymer of a bifunctional monomer.

The bifunctional monomer may include hexanediol diacrylate (1,6 hexanediol diacrylate, HDDA).

The display apparatus may further include a second light-shielding layer arranged on the first light-shielding layer, the second light-shielding layer including a second set of opening portions overlapping the first set of opening portions.

The display apparatus may further include a first color filter layer, a second color filter layer, and a third color filter layer, each arranged in the second set of opening portions and overlapping the first color conversion layer, the second color conversion layer, and the third color conversion layer, respectively.

The inner surface defining the first set of opening portions of the first light-shielding layer may include a tapered inclined surface.

The metal layer may include a first surface in contact with the first light-shielding layer, and a second surface opposite the first surface, wherein a first angle may be greater than a second angle, the first angle being formed by a lower surface of the first light-shielding layer that faces the encapsulation layer and the first surface of the metal layer, and the second angle being formed by the lower surface of the first light-shielding layer and the second surface of the metal layer.

One or more embodiments of the present disclosure provide a method of manufacturing a display apparatus, the method including: preparing a substrate on which a first light-emitting element, a second light-emitting element, and a third light-emitting element are arranged, the first light-emitting element, the second light-emitting element, and the third light-emitting element each including an emission layer of a first color, forming, on the substrate, a first light-shielding layer including a first set of opening portions corresponding to the first to third light-emitting elements, respectively, forming a liquid repellent layer on the first light-shielding layer, spraying a first ink into the first set of opening portions, the first ink including at least two solvents, and drying the first ink to form a metal layer in the first set of opening portions.

The at least two solvents of the first ink may include first and second solvents having different vapor pressures from each other.

The first ink may include 50 wt % or more of the first solvent.

The first solvent may have a greater vapor pressure than the second solvent.

The drying of the first ink may include a first drying task of drying (evaporating) the first solvent, and a second drying task of drying (evaporating) the second solvent.

The first ink may include a mixture of titanium oxide ($TiO_2$) or silver (Ag) nanoparticles and a bifunctional monomer.

The mixture of the first ink may be less than 30 wt %.

The bifunctional monomer of the first ink may include hexanediol diacrylate (1,6 hexanediol diacrylate, HDDA).

The method may further include performing a photocuring and/or thermal curing process drying the first ink.

The method may further include spraying a second ink into the first set of opening portions, the second ink including scattering particles and quantum dots.

Other features and advantages of the present disclosure will become more apparent from the drawings, the claims, and the detailed description.

These general and specific embodiments may be implemented by utilizing a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 5A-5G are cross-sectional views illustrating some operations of a method of manufacturing a display apparatus according to an embodiment;

DETAILED DESCRIPTION

Figure 1:
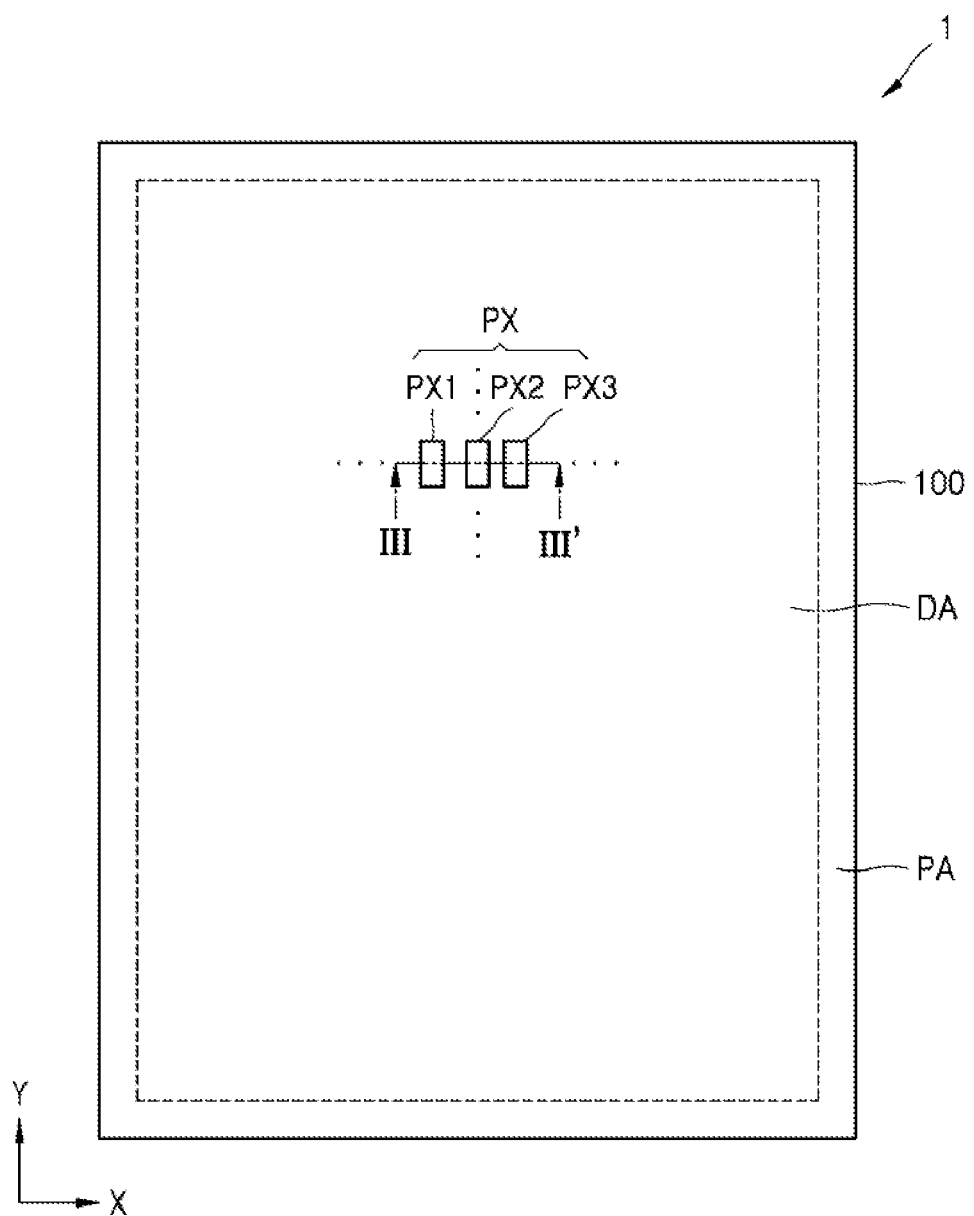
FIG. 1 is a plan view schematically illustrating a display apparatus according to an embodiment.

Reference will now be made in detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, area, or component is referred to as being "on" another layer, area, or component, it can be directly or indirectly on the other layer, area, or component. That is, for example, intervening layers, areas, or components may be present. When an element is referred to as being "directly on," another element, there are no intervening elements present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In this specification, the expression "A and/or B" indicates only A, only B, or both A and B. Throughout the disclosure, the expression "at least one selected from A and B" indicates only A, only B, or both A and B.

It will be further understood that, when layers, areas, or components are referred to as being connected to each other, they may be directly connected to each other or indirectly connected to each other with intervening layers, areas, or components therebetween. For example, when layers, areas, or components are referred to as being electrically connected to each other, they may be directly electrically connected to each other or indirectly electrically connected to each other with intervening layers, areas, or components therebetween. When an element is referred to as being "directly connected to," another element, there are no intervening elements present.

The x-axis, the y-axis, and the z-axis are not limited to three axes of the rectangular (Cartesian) coordinate system, and in some embodiments may be interpreted in a broader sense. For example, the x-axis, the y-axis, and the z-axis may represent directions that are perpendicular to one another, or may represent directions that are not perpendicular to one another.

FIG. 1 is a plan view schematically illustrating a display apparatus 1 according to an embodiment.

Referring to FIG. 1, the display apparatus 1 may include a display area DA and a peripheral area PA outside the display area DA. The display apparatus 1 may provide an image through an array of a plurality of pixels PX arranged two-dimensionally in the display area DA. The pixels PX may include a first pixel PX1, a second pixel PX2, and a third pixel PX3. The peripheral area PA is an area that does not provide an image, and may completely or partially surround the display area DA. A driver and/or the like that provides an electrical signal or power to a pixel circuit corresponding to each of the pixels PX may be in the peripheral area PA. A pad to which an electronic element, a printed circuit board, and/or the like is connectable may be in the peripheral area PA.

The display apparatus 1 may include an organic light-emitting diode (OLED) as a light-emitting element, but the display apparatus 1 of the present disclosure is not limited thereto. In another embodiment, the display apparatus 1 may be a light-emitting display including an inorganic light-emitting diode (e.g., an inorganic light-emitting display or an inorganic electroluminescent (EL) display). The inorganic light-emitting diode may include (e.g., be) a PN diode including one or more inorganic semiconductor materials. When a voltage is applied in a forward direction to the PN junction diode, holes and electrons are injected, and energy generated due to recombination of the holes and the electrons may be converted into light energy to emit light of a selected color. The inorganic light-emitting diode may have a width ranging from several to hundreds of micrometers, and, in some embodiments, the inorganic light-emitting diode may be referred to as a micro-light-emitting diode (LED).

Figure 2:
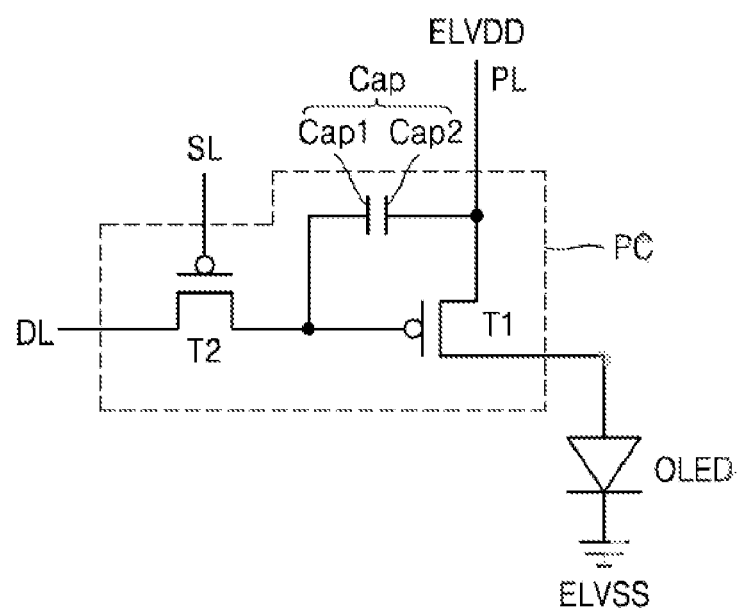
FIG. 2 is an equivalent circuit diagram of a pixel circuit connected to a light-emitting element included in a display apparatus according to an embodiment.

FIG. 2 is an equivalent circuit diagram of a pixel circuit connected to a light-emitting element included in the display apparatus 1 according to an embodiment.

Referring to FIG. 2, the display apparatus 1 (see FIG. 1) may include a light-emitting element and a pixel circuit PC. The light-emitting element may include a light-emitting diode, for example, an organic light-emitting diode OLED. The organic light-emitting diode OLED may be electrically connected to the pixel circuit PC and may receive a driving voltage through the pixel circuit PC to emit light. The light-emitting element may be to emit light through an emission area.

The pixel circuit PC may include a plurality of thin-film transistors and a storage capacitor. In an embodiment, the pixel circuit PC may include a first thin-film transistor T1, a second thin-film transistor T2, and a storage capacitor Cap.

The second thin-film transistor T2 that is a switching thin-film transistor may be connected to a scan line SL and a data line DL, and may transmit a data voltage (or a data signal) input from the data line DL to the first thin-film transistor T1 based on a switching voltage (or a switching signal) input from the scan line SL.

The storage capacitor Cap may be connected to the second thin-film transistor T2 and a driving voltage line PL and may be configured to store a voltage corresponding to a difference between a voltage received from the second thin-film transistor T2 and a first power supply voltage ELVDD applied to the driving voltage line PL. The storage capacitor Cap may include at least a first storage plate Cap1 and a second storage plate Cap2.

The first thin-film transistor T1 is a driving thin-film transistor that may be connected to the driving voltage line PL and the storage capacitor Cap and configured to control a driving current flowing from the driving voltage line PL to the organic light-emitting diode OLED according to a voltage value stored in the storage capacitor Cap. The organic light-emitting diode OLED may be to emit light having a certain luminance according to the driving current. An opposite electrode (e.g., a cathode) of the organic light-emitting diode OLED may be configured to receive a second power supply voltage ELVSS.

Although the pixel circuit PC includes two thin-film transistors and one storage capacitor in FIG. 2, the present disclosure is not limited thereto. For example, the pixel circuit PC may include three or more thin-film transistors and/or two or more storage capacitors. In an embodiment, the pixel circuit PC may include seven thin-film transistors and one storage capacitor. The number of thin-film transistors and the number of storage capacitors may be suitably modified according to a design of the pixel circuit PC. However, for convenience of explanation, the following will be described assuming that the pixel circuit PC includes two thin-film transistors and one storage capacitor.

Figure 3:
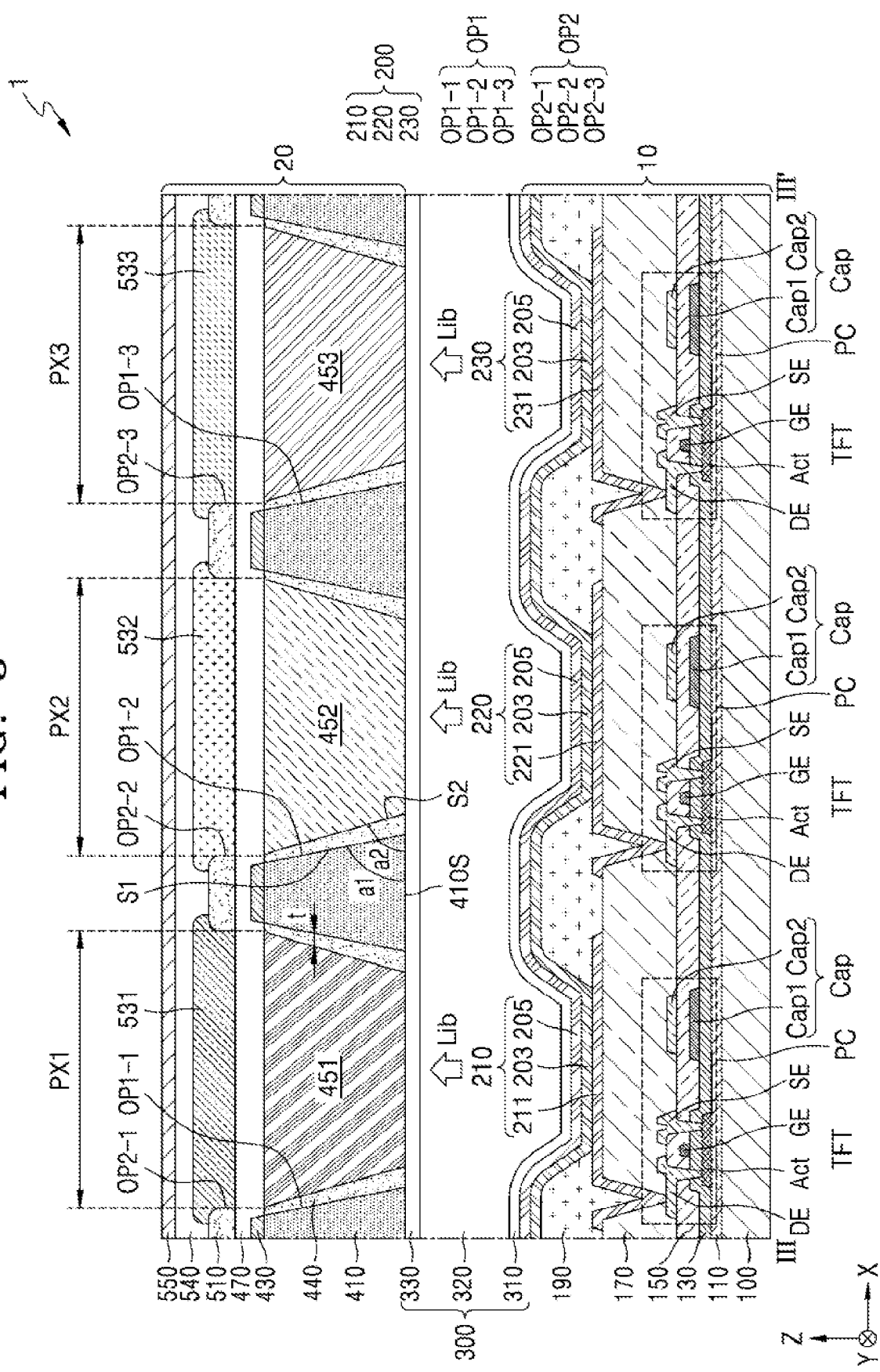
FIG. 3 is a cross-sectional view schematically illustrating a portion of the display apparatus of FIG. 1.

FIG. 3 is a cross-sectional view schematically illustrating a portion of the display apparatus 1 of FIG. 1, taken along line III-III' in FIG. 1.

Referring to FIG. 3, the display apparatus 1 may include a plurality of pixels PX. The pixels PX may include, for example, first to third pixels PX1 to PX3. The display apparatus 1 includes a plurality of layers, and hereinafter, for convenience of description, the stacked order will be mainly described.

The display apparatus 1 may include a substrate 100. The substrate 100 may include glass, a metal, or a polymer resin. For example, the substrate 100 may include a polymer resin (such as polyether sulfone, polyacrylate, polyether imide, polyethylene naphthalate, polyethylene terephthalate, polyphenylene sulfide, polyarylate, polyimide, polycarbonate, and/or cellulose acetate propionate). When the substrate 100 includes the above-described polymer resin, the substrate 100 may be flexible and/or bendable. For example, the substrate 100 may have a multi-layer structure including two layers, each of the two layers including a polymer resin, and a barrier layer including an inorganic material between the two layers. For example, the barrier layer may include an inorganic material (such as silicon oxide, silicon nitride, and/or silicon oxynitride).

A plurality of light-emitting elements 200 may be arranged above the substrate 100. FIG. 3 illustrates that a first light-emitting element 210, a second light-emitting element 220, and a third light-emitting element 230. In addition to the light-emitting elements 200, pixel circuits PC respectively electrically connected to the light-emitting elements 200 may be above the substrate 100. The pixel circuit PC includes the thin-film transistors TFT and the storage capacitor Cap (e.g., as in FIG. 2), and the first to third light-emitting elements 210, 220 and 230 may be above the pixel circuit PC.

Each of the thin-film transistors TFT may include a semiconductor layer Act, a gate electrode GE overlapping a channel area of the semiconductor layer Act, and a source electrode SE and a drain electrode DE respectively connected to a source area and a drain area of the semiconductor layer Act.

The semiconductor layer Act may include polysilicon. In some embodiments, the semiconductor layer Act may include amorphous silicon. In some embodiments, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act may include the channel area, and the source area and the drain area may be doped with impurities.

The gate electrode GE may include a low-resistance conductive material such as molybdenum (Mo), aluminum (Al), copper (Cu), and/or Ti, and may have a single or multi-layer structure including the above material.

The source electrode SE or the drain electrode DE may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu, and may have a single or multi-layer structure including the above material. In some embodiments, the source electrode SE or the drain electrode DE may further include a material such as indium tin oxide (ITO) on a layer including the aforementioned metal. For example, the source electrode SE or the drain electrode DE may be variously changed, such as having a stack structure of a Ti layer/Al layer/Ti layer or including a stack structure of a Ti layer/Cu layer/ITO layer.

The storage capacitor Cap may include a first storage plate Cap1 and a second storage plate Cap2 overlapping each other. The first storage plate Cap1 may be on the same layer as a layer on which the gate electrode GE is arranged, and may include the same material as that of the gate electrode GE. The second storage plate Cap2 may be on the same layer as a layer on which the source electrode SE or the drain electrode DE is arranged, and may include the same material as that of the source electrode SE or the drain electrode DE. An insulating layer may be between the first storage plate Cap1 and the second storage plate Cap2 of the storage capacitor Cap, and the first storage plate Cap1 and the second storage plate Cap2 may overlap each other to form a capacitor. In this case, the insulating layer may function as a dielectric layer of the storage capacitor Cap.

Although FIG. 3 illustrates that the gate electrode GE of the thin-film transistor TFT and the first storage plate Cap1 of the storage capacitor Cap are separately arranged, the storage capacitor Cap may overlap the thin-film transistor TFT. In this case, the gate electrode GE of the thin-film transistor TFT may function as the first storage plate Cap1 of the storage capacitor Cap.

A buffer layer 110 may be between the substrate 100 and the semiconductor layer Act. The buffer layer 110 may reduce or block penetration of foreign matter, moisture, and/or ambient air from the bottom of (e.g., below) the substrate 100, and may provide a flat surface on (e.g., planarize) the substrate 100. The buffer layer 110 may include an inorganic insulating material (such as silicon oxide, silicon oxynitride, and/or silicon nitride), and may have a single-layered structure or a multi-layered structure including the aforementioned materials.

In order to secure electrical insulation between the semiconductor layer Act and the gate electrode GE, a gate insulating film 130 may be between the semiconductor layer Act and the gate electrode GE. The gate insulating film 130 may include an inorganic material (such as silicon oxide, silicon nitride, and/or silicon oxynitride).

In some embodiments, an interlayer insulating layer 150 may be above the gate electrode GE and the first storage plate Cap1. The interlayer insulating layer 150 may include an inorganic material (such as silicon oxide, silicon nitride, and/or silicon oxynitride). The source electrode SE, the drain electrode DE, and the second storage plate Cap2 may be above the interlayer insulating layer 150. The interlayer insulating layer 150 including such an inorganic material may be formed through chemical vapor deposition (CVD) or atomic layer deposition (ALD). The same will apply to the following embodiments and modifications thereof.

A planarization layer 170 may be above the thin-film transistor TFT. For example, when an organic light-emitting diode is above the thin-film transistor TFT as illustrated in FIG. 3, the planarization layer 170 may roughly planarize a protective layer covering the thin-film transistor TFT. The planarization layer 170 may include, for example, an organic material (such as acryl, benzocyclobutene (BCB), and/or hexamethyldisiloxane (HMDSO)). Although FIG. 3 illustrates that the planarization layer 170 has a single-layered structure, various modifications may be made thereto. In some embodiments, for example, the planarization layer 170 may have a multi-layered structure.

The first to third light-emitting elements 210, 220, and 230 may be above the planarization layer 170 of the substrate 100. In an embodiment, the first to third light-emitting elements 210, 220, and 230 may each have the same structure. Hereinafter, for convenience of explanation, the first light-emitting element 210 will be described.

A stacked structure of a first pixel electrode 211, an intermediate layer 203, and an opposite electrode 205 may form the first light-emitting element 210. An organic light-emitting diode may be used as the light-emitting element. The organic light-emitting diode may be to emit light of a first color in a first direction (e.g., along the z-direction), and an emission area of the organic light-emitting diode may correspond to a pixel PX.

For example, the first light-emitting element 210 may include the first pixel electrode 211, the opposite electrode 205, and the intermediate layer 203 therebetween. The intermediate layer 203 may include an emission layer. The first pixel electrode 211 may be in contact with one of the source electrode SE and the drain electrode DE via a contact hole formed in the planarization layer 170 and/or the like, such that the first pixel electrode 211 is electrically connected to the thin-film transistor TFT. The first pixel electrode 211 includes a transmissive conductive layer including a transmissive conductive oxide (such as indium tin oxide (ITO), $In_2O_3$, and/or indium zinc oxide (IZO)), and a metal layer including a metal (such as Al and/or Ag). For example, the first to third pixel electrodes 211, 221, and 231 may each have a three-layer structure of ITO/Ag/ITO.

An upper insulating layer 190 may be above the planarization layer 170. The upper insulating layer 190 may have one or more openings, through which central portions of each of the first to third pixel electrodes 211, 221, and 231 are exposed. The upper insulating layer 190 may prevent or reduce an arc and/or the like from occurring between edges of the first to third pixel electrodes 211, 221, and 231 and the opposite electrode 205 by increasing a distance between the edges of each of the first to third pixel electrodes 211, 221, and 231 and the opposite electrode 205 (e.g., in non-pixel regions). The upper insulating layer 190 may include an organic material such as polyimide and/or HMDSO.

The intermediate layer 203 includes an emission layer and may be above the first pixel electrode 211. The emission layer may be to emit light of a first color. The emission layer may be to emit light of a first color (e.g., blue light) having a central wavelength of, for example, about 450 nm to about 495 nm.

The intermediate layer 203 may include a low molecular weight material and/or a high molecular weight material. When the intermediate layer 203 includes a low molecular weight material, the intermediate layer 203 may have a structure in which a hole injection layer (HIL), a hole transport layer (HTL), an emission layer (EML), an electron transport layer (ETL), and an electron injection layer (EIL) are stacked as (or into) a single (e.g., integrated) or multiple (e.g., laminated) structure. The intermediate layer 203 may be formed by vacuum deposition. When the intermediate layer 203 includes a high molecular weight material, the intermediate layer 203 may have a structure including an HTL and an EML. In this case, the HTL may include poly(3,4-ethylene dioxythiophene) (PEDOT), and the EML may include a poly-phenylenevinylene (PPV)-based polymer and/or a polyfluorene-based polymer. The intermediate layer 203 may be formed by screen printing, inkjet printing, deposition, and/or laser induced thermal imaging (LITI). However, the intermediate layer 203 is not necessarily limited thereto. The intermediate layer 203 may have any suitable structure.

For example, the intermediate layer 203 may be integrally formed over the first to third pixel electrodes 211, 221, and 231. For example, an emission layer, and the above-described functional layers (such as the HIL, the HTL, the EML, the ETL, and/or the EIL) may be integrally formed above the substrate 100.

The opposite electrode 205 may be above (on) the intermediate layer 203. The opposite electrode 205 may correspond to (e.g., overlap) the first to third pixel electrodes 211, 221, and 231, and may be integrally formed over a plurality of pixel electrodes. The opposite electrode 205 may include a transparent conductive layer formed of ITO, $In_2O_3$, and/or IZO, and in some embodiments may include a semi-transparent layer including Ag, Mg, Al, Ni, Cr, Li, Ca, or an alloy thereof. For example, the opposite electrode 205 may be a semi-permeable film including Ag and Mg.

Because the first to third light-emitting elements 210, 220, and 230 may be easily damaged by moisture and/or oxygen from the outside, an encapsulation layer 300 may cover the first to third light-emitting elements 210, 220, and 230 to protect them.

The encapsulation layer 300 may be above the opposite electrode 205. The encapsulation layer 300 may include first and second inorganic encapsulation layers 310 and 330, and an organic encapsulation layer 320 therebetween.

The first and second inorganic encapsulation layers 310 and 330 may each include one or more inorganic insulating materials. The one or more inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through CVD.

The organic encapsulation layer 320 may include a polymer-based material. Non-limiting examples of the polymer-based material include an acrylic resin, an epoxy resin, a polyimide, and a polyethylene. For example, the organic encapsulation layer 320 may include an acrylic resin, for example, polymethyl methacrylate, polyacrylic acid, and/or the like. The organic encapsulation layer 320 may be formed by curing a monomer or applying a polymer.

A structure including stacked layers from the substrate 100 to the first to third light-emitting elements 210, 220, and 230 may be referred to as the light-emitting unit 10. Light emitted from (by) the light-emitting unit 10 is referred to as incident light Lib on an optical unit 20. For example, light of a first color emitted by the first to third light-emitting elements 210, 220, and 230 may pass through the encapsulation layer 300 and proceed to the optical unit 20.

The optical unit 20 may include a stacked structure including a first light-shielding layer 410, a liquid repellent layer 430, a metal layer 440, a first color conversion layer 451, a second color conversion layer 452, a light-transmitting layer 453, and a first capping layer 470, a second light-shielding layer 510, a first color filter layer 531, a second color filter layer 532, a third color filter layer 533, and a second capping layer 550.

The first color conversion layer 451 and the first color filter layer 531 may be arranged to overlap the first light-emitting element 210, and the second color conversion layer 452 and the second color filter layer 532 may be arranged to overlap the second light-emitting element 220. In addition, the light-transmitting layer 453 and the third color filter layer 533 may be arranged to overlap the third light-emitting element 230.

The first light-shielding layer 410 may include a first set of opening portions OP1 corresponding to the light-emitting element 200. The first light-shielding layer 410 may include a $(1-1)^{st}$ (first) opening portion OP1-1, a $(1-2)^{nd}$ (second) opening portion OP1-2, and a $(1-3)^{rd}$ (third) opening portion OP1-3 respectively corresponding to the first light-emitting element 210, the second light-emitting element 220, and the third light-emitting element 230.

The inner surfaces defining the first set of opening portions OP1 of the first light-shielding layer 410 may (each) include a tapered inclined surface. For example, an inner surface of the first light-shielding layer 410 may include a forward tapered surface (e.g., so that the inner surface downslopes toward the center axis of the pixel). Therefore, the $(1-1)^{st}$ opening portion OP1-1, the $(1-2)^{nd}$ opening portion OP1-2, and the $(1-3)^{rd}$ opening portion OP1-3 may gradually increase in width in a direction away from the substrate 100.

The inner surface of the first light-shielding layer 410 may form a first angle a1 with respect to a lower surface 410S of the first light-shielding layer 410. In an embodiment, the first angle a1 may be an acute angle, that is, less than 90 degrees, and in this case, the first light-shielding layer 410 may have a trapezoidal cross-section. For example, a width of a portion of the first light-shielding layer 410 between two adjacent opening portions among the $(1-1)^{st}$ opening portion OP1-1, the $(1-2)^{nd}$ opening portion OP1-2, and the $(1-3)^{rd}$ opening portion OP1-3 may decrease along the z-direction with an increase in a distance from the light-emitting unit 10 and/or the substrate 100.

The first light-shielding layer 410 may have any suitable color (such as black, white, red, purple, and/or blue). The first light-shielding layer 410 may include a colored pigment or dye. The first light-shielding layer 410 may include a light-shielding material. The light-shielding material may include an opaque inorganic insulating material including a metal oxide (such as titanium oxide ($TiO_2$), chromium oxide ($Cr_2O_3$), and/or molybdenum oxide ($MoO_3$)), or may include an opaque organic insulating material (such as a black resin). In another example, the first light-shielding layer 410 may include an organic insulating material (such as a white resin).

As described below, the first light-shielding layer 410 may prevent or reduce color mixing between wavelengths of light converted or transmitted by the first color conversion layer 451, the second color conversion layer 452, and the light-transmitting layer 453, which are adjacent to each other.

The first color conversion layer 451, the second color conversion layer 452, and the light-transmitting layer 453 may be in the $(1-1)^{st}$ opening portion OP1-1, the $(1-2)^{nd}$ opening portion OP1-2, and the $(1-3)^{rd}$ opening portion OP1-3, respectively. The first color conversion layer 451, the second color conversion layer 452, and the light-transmitting layer 453 may be apart from each other by a material portion of the first light-shielding layer 410 therebetween.

The first color conversion layer 451, the second color conversion layer 452, and the light-transmitting layer 453 may be to convert or transmit incident light Lib generated by the light-emitting unit 10 into light of another color and may be to emit the light toward the first to third color filter layers 531, 532, and 533. The light converted or transmitted by the first color conversion layer 451, the second color conversion layer 452, and the light-transmitting layer 453 may be one of red light, green light, and blue light.

The incident light Lib may be blue light having a wavelength of about 400 nm or more and less than about 495 nm, and the light emitted (transmitted) through the first to third color filter layers 531, 532, and 533 may include red light having a wavelength of about 580 nm or more, green light having a wavelength of about 495 nm or more and less than about 580 nm, and blue light having a wavelength of about 400 nm or more and less than about 495 nm.

The incident light Lib may be converted into red light (e.g., red light having a central wavelength of about 580 nm or more and less than about 750 nm) through the first color conversion layer 451, and may pass through the first color filter layer 531 and be emitted to the outside. The first color filter layer 531 includes a red pigment or dye and may be to selectively transmit red light.

The incident light Lib may be converted to green light through the second color conversion layer 452 (e.g., green light having a central wavelength of about 495 nm or more and less than about 580 nm), and may pass through the second color filter layer 532 and be emitted to the outside. The second color filter layer 532 includes a green pigment or dye, and may be to selectively transmit green light.

The incident light Lib may be transmitted through the light-transmitting layer 453 without color conversion and emitted toward the third color filter layer 533, and the light passing through the third color filter layer 533 may be emitted to the outside. The third color filter layer 533 includes a blue pigment or dye and may be to selectively transmit blue light.

Therefore, the incident light Lib emitted from the light-emitting unit 10 is converted green light or red light, or transmitted as blue light while passing through the first color conversion layer 451, the second color conversion layer 452, and the light-transmitting layer 453, thereby displaying a color image.

In an embodiment, the first color conversion layer 451, the second color conversion layer 452, and the light-transmitting layer 453 may each be formed by an inkjet printing process. Inks respectively forming the first color conversion layer 451, the second color conversion layer 452, and the light-transmitting layer 453 may be sprayed into the first set of opening portions OP1 of the first light-shielding layer 410, thus forming the first color conversion layer 451, the second color conversion layer 452, and the light-transmitting layer 453.

The liquid repellent layer 430 may be above the first light-shielding layer 410. The liquid repellent layer 430 does not overlap the first set of opening portions OP1 of the first light-shielding layer 410, and may be between the first set of opening portions OP1 on a plane (e.g., when viewed normal to a thickness direction, for example along the z-direction). For example, the liquid repellent layer 430 may overlap an area in which a light-shielding material of the first light-shielding layer 410 is located.

The liquid repellent layer 430 may include a liquid repellent material having liquid repellency properties for materials forming the first color conversion layer 451, the second color conversion layer 452, and the light-transmitting layer 453. The liquid repellent material may include an organic polymer material having hydrophobicity. For example, the liquid repellent material may include an organic material including fluorine (F).

During an inkjet printing process of forming the first color conversion layer 451, the second color conversion layer 452 and the light-transmitting layer 453, the liquid repellent layer 430 may impart liquid repellency so that inks forming the first color conversion layer 451, the second color conversion layer 452, and the light-transmitting layer 453 are located in the first set of opening portions OP1, instead of being located on the first light-shielding layer 410. The inks have hydrophilicity and the liquid repellent layer 430 has hydrophobicity, and thus, the liquid repellent layer 430 may prevent or reduce inks from overflowing from the first set of opening portions OP1 into adjacent opening portions of the first set of opening portions OP1. Accordingly, mixing between adjacent ones of the first color conversion layer 451, the second color conversion layer 452, and the light-transmitting layer 453 may be prevented or reduced, and color mixing between pixels may be prevented or reduced, thus improving the manufacturing quality of the display apparatus.

The metal layer 440 may be on inner sides (surfaces) of the first light-shielding layer 410 defining/facing the first set of opening portions OP1. That is, the metal layer 440 may be between each side (side surface) of the first color conversion layer 451, the second color conversion layer 452, and the light-transmitting layer 453 and a respective inner side (side surface) of the first light-shielding layer 410. In a first direction (e.g., along the z-direction) away from the light-emitting unit 10 and/or the substrate 100, a width t of the metal layer 440 in a second direction perpendicular to the first direction may gradually decrease. In an embodiment, the first direction may be a z direction, and the second direction may be an x direction or a y direction. The thickness t of the metal layer 440 may be less than about 2 μm.

The metal layer 440 may include a first surface S1 contacting the inner surface of the first light-shielding layer 410, and a second surface S2 opposite to the first surface S1 (e.g., contacting the first color conversion layer 451, the second color conversion layer 452, or the light-transmitting layer 453). The lower surface 410S facing the encapsulation layer 300 of the first light-shielding layer 410 and the first surface S1 of the metal layer 440 may achieve/form a first angle a1. The lower surface 410S of the first light-shielding layer 410 and the second surface S2 of the metal layer 440 may achieve/form the second angle a2. According to an embodiment, the thickness t of the metal layer 440 increases as the metal layer 440 approaches the encapsulation layer 300, and thus, the second angle a2 may be less (smaller) than the first angle a1.

In an embodiment, the metal layer 440 may include $TiO_2$ as a scattering material. Light reaching the metal layer 440 may be scattered from a surface of the metal layer 440 and may proceed in various paths. Through this, the degree of color conversion of the incident light Lib may be increased within the first color conversion layer 451 or the second color conversion layer 452, and thus, light conversion efficiency may be improved.

In another embodiment, the metal layer 440 may include Ag nanoparticles. Ag nanoparticles have excellent reflectance, and thus light reaching the metal layer 440 may be reflected from a surface of the metal layer 440. Therefore, the degree of light absorption of the incident light Lib (incident on the first color conversion layer 451, the second color conversion layer 452, or the light-transmitting layer 453) by the light-shielding material of the first light-shielding layer 410 may be reduced, thus improving light extraction efficiency and/or luminance. In addition, the Ag nanoparticles may strongly resonate with visible light due to surface plasmon resonance, thereby scattering the visible light. Through this, light reaching the metal layer 440 may be strongly scattered, and thus, light conversion efficiency may be improved.

In some embodiments, the metal layer 440 may include a polymer. In an embodiment, the polymer of the metal layer 440 may include a polymer formed by a condensation reaction of a multifunctional monomer including a bifunctional monomer. The multifunctional monomers may have multiple functional groups and may be bonded to other monomers at multiple positions. For example, the bifunctional monomer may include hexanediol diacrylate (1,6 hexanediol diacrylate, HDDA). The polymer may enable the metal layer 440 to be stably formed without collapsing on the inner surface(s) of the first set of opening portions OP1 of the first light-shielding layer 410. As another example, the polymer of the metal layer 440 may be a polymer formed by a condensation reaction of a liquid crystalline monomer.

The first capping layer 470 may be above the first color conversion layer 451, the second color conversion layer 452, and the light-transmitting layer 453. The first capping layer 470 may cover the first color conversion layer 451, the second color conversion layer 452, and the light-transmitting layer 453. The first capping layer 470 may include an inorganic insulating material (such as silicon nitride, silicon oxide, and/or silicon oxynitride).

The first capping layer 470 and the encapsulation layer 300 may be arranged so that a first color conversion layer 451, a second color conversion layer 452, and a light-transmitting layer 453 are therebetween. The first and second color conversion layers 451 and 452 may each include quantum dots, as described below with reference to FIG. 4. Because the quantum dots include nanoparticles, the quantum dots may deteriorate due to the reaction with moisture, oxygen, or the like. Therefore, the first capping layer 470 and the encapsulation layer 300 may cover the first and second color conversion layers 451 and 452 above and under the first and second color conversion layers 451 and 452, so as to prevent or reduce moisture, oxygen, and/or the like from being introduced into the quantum dots in the first and second color conversion layers 451 and 452.

The second light-shielding layer 510 may be above the first capping layer 470. The second light-shielding layer 510 may include the second set of opening portions OP2 respectively overlapping the first set of opening portions OP1. The second light-shielding layer 510 may include a light-shielding material. The light-shielding material may include an opaque inorganic insulating material including a metal oxide (such as $TiO_2$, $Cr_2O_3$, and/or $MoO_3$), or may include an opaque organic insulating material (such as a black resin). The second light-shielding layer 510 may block light from being emitted to the outside of the emission area, thereby preventing or reducing light leakage in the display apparatus 1.

The first to third color filter layers 531, 532, and 533 may be in the second set of opening portions OP2 of the second light-shielding layer 510, respectively. For example, the first color filter layer 531 may be in a $(2-1)^{st}$ (first) opening portion OP2-1 corresponding to the first light-emitting element 210, the second color filter layer 532 may be in a $(2-2)^{nd}$ (second) opening portion OP2-2 corresponding to the second light-emitting element 220, and the third color filter layer 533 may be in a $(2-3)^{rd}$ (third) opening portion OP2-3 corresponding to the third light-emitting element 230. As another example, some of the first to third color filter layers 531, 532, and 533 may be above the second light-shielding layer 510.

The first to third color filter layers 531, 532, and 533 may each include an organic pattern including a dye and/or pigment. As described above, the first to third color filter layers 531, 532, and 533 may include pigments and/or dyes of different colors, respectively, and may be to selectively transmit light of a specific color.

Considering the amount of each color light emitted from the display apparatus 1, a width and/or thickness of the third color filter layer 533 may be greater than a width and/or thickness of each of the first color filter layer 531 and the second color filter layer 532.

In some embodiments, the second light-shielding layer 510 may include the same material as that of the third color filter layer 533 and may be formed by the same process. In this case, the first color filter layer 531 may be in the $(2-1)^{st}$ opening portion OP2-1 corresponding to the first light-emitting element 210, the second color filter layer 532 may be in the $(2-2)^{nd}$ opening portion OP2-2 corresponding to the second light-emitting element 220, the $(2-3)^{rd}$ opening portion OP2-3 is not formed at a position corresponding to the third light-emitting element 230, and a portion of the second light-shielding layer 510 may function as the third color filter layer 533. A portion of the second light-shielding layer 510 between the first color filter layer 531 and the second color filter layer 532 may prevent or reduce color mixing between wavelengths of light converted by the first color conversion layer 451 and second color conversion layer 452, which are adjacent to each other.

A filler 540 may be above the second light-shielding layer 510 and may cover the first to third color filter layers 531, 532, and 533. The filler 540 may buffer an external pressure and/or the like, and may provide a flat upper surface. The filler 540 may include an organic material (such as an acrylic resin, an epoxy resin, polyimide, and/or polyethylene).

A second capping layer 550 may be above the filler 540. The second capping layer 550 may include an inorganic insulating material (such as silicon nitride, silicon oxide, and/or silicon oxynitride).

The case in which the light-emitting unit 10 and the optical unit 20 of the display apparatus 1 are formed on one substrate has been described. However, in another embodiment, a display apparatus 1 may be manufactured by forming a light-emitting unit 10 and an encapsulation layer 300 on a lower substrate, forming an optical unit 20 on an upper substrate, and bonding the lower substrate to the upper substrate. In this case, the width t of the metal layer 440 may gradually decrease from the upper substrate toward the lower substrate.

Figure 4:
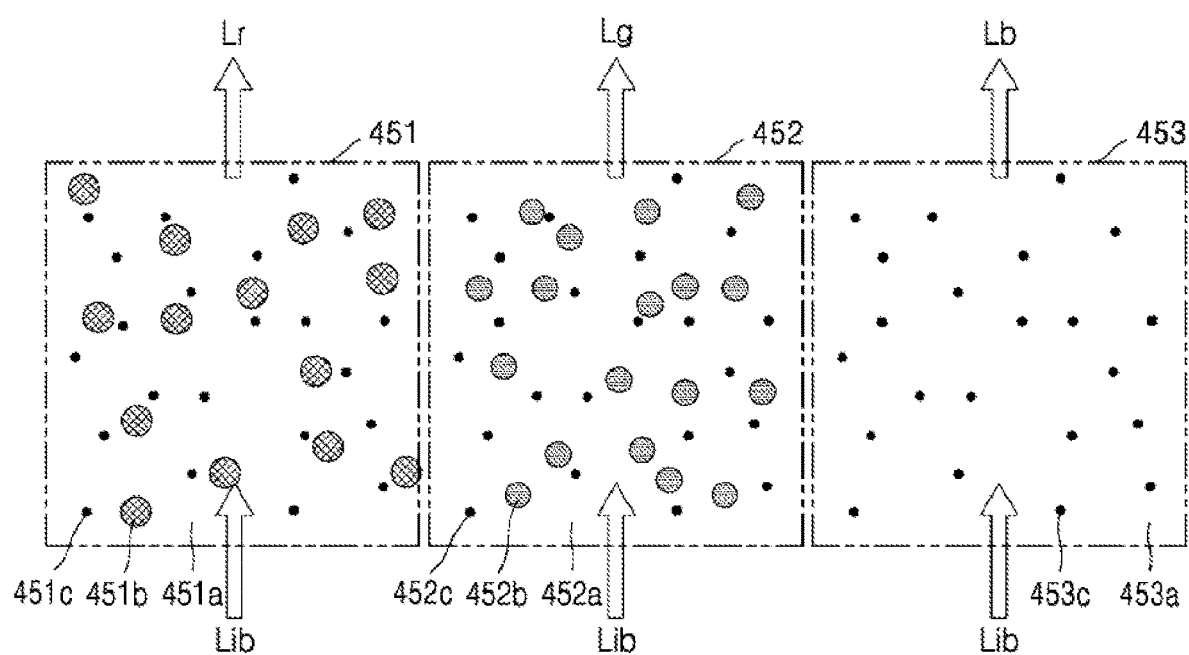
FIG. 4 is an enlarged cross-sectional view illustrating a first color conversion layer, a second color conversion layer, and a light-transmitting layer in a display apparatus according to an embodiment.

FIG. 4 is an enlarged cross-sectional view illustrating a first color conversion layer, a second color conversion layer, and a light-transmitting layer in a display apparatus 1 according to an embodiment.

Referring to FIG. 4, the display apparatus 1 according to the embodiment may include a first color conversion layer 451, a second color conversion layer 452, and a light-transmitting layer 453.

For example, the first color conversion layer 451 may convert blue incident light Lib into red light Lr. To this end, the first color conversion layer 451 may include a first photosensitive polymer 451a in which first quantum dots 451b are dispersed.

The first photosensitive polymer 451a is not particularly limited as long as it is a material having excellent dispersion characteristics and light transmission properties, but may include, for example, an acrylic resin, an imide resin, and/or an epoxy resin.

The first quantum dots 451b may be excited by the blue incident light Lib to isotropically emit the red light Lr having a wavelength longer than that of blue light. In the present specification, the term "quantum dot" refers to a crystal of a semiconductor compound, and may include any material capable of emitting light of various wavelengths according to the size of the crystal.

The first quantum dots 451b may be synthesized by a wet chemical process, an organometallic CVD process, a molecular beam epitaxy process, or a similar process. A wet chemical process is a method of growing quantum dot particle crystals after mixing an organic solvent with a precursor material. When the crystal is grown, the organic solvent naturally acts as a dispersant coordinated on a surface of a quantum dot crystal, and controls the growth of the crystal. Therefore, the growth of quantum dot particles may be controlled through an easier and inexpensive process compared to a vapor deposition method (such as metal organic CVD (MOCVD) and/or molecular beam epitaxy (MBE)).

The first quantum dots 451b may include a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, a Group IV element or semiconductor compound, or any combination thereof.

Non-limiting examples of the Group III-VI semiconductor compound include binary compounds (such as $In_2S_3$), ternary compounds (such as AgInS, $AgInS_2$, CuInS, $CuInS_2$, and/or the like), or any combination thereof.

Non-limiting examples of the Group II-VI semiconductor compound include binary compounds (such as CdS, CdSe, CdTe, ZnS, ZnSe, ZnTe, ZnO, HgS, HgSe, HgTe, MgSe, MgS, and/or the like), ternary compounds (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, MgZnTe, HgZnS, MgZn, and/or the like), quaternary compounds (such as CdZnSeS, CdZnSeTe, CdZnSTe, CdHgSeS, CdHgSeTe, CdHgSTe, HgZnSeS, HgZnSeTe, HgZnSTe, and/or the like), or any combination thereof.

Non-limiting examples of the Group III-V semiconductor compound include binary compounds (such as GaN, GaP, GaAs, GaSb, AlN, AlP, AlAs, AlSb, InN, InP, InAs, InSb, and/or the like), ternary compounds (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and/or the like), quaternary compounds (such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like), or any combination thereof. In addition, the Group III-V semiconductor compound may further include a Group II element. Non-limiting examples of the Group III-V semiconductor compound further including a Group II element include InZnP, InGaZnP, InAlZnP, and/or the like.

Non-limiting examples of the Group III-VI group semiconductor compound include binary compounds (such as GaS, GaSe, $Ga_2Se_3$, GaTe, InS, InSe, $In_2Se_3$, InTe, and/or the like), ternary compounds (such as $InGaS_3$ and/or $InGaSe_3$), or any combination thereof.

Non-limiting examples of the Group I-III-VI semiconductor compound include ternary compounds (such as AgInS, $AgInS_2$, CuInS, $CuInS_2$, $CuGaO_2$, $AgGaO_2$, $AgAlO_2$, and/or any combination thereof).

Non-limiting examples of the Group IV-VI semiconductor compound include binary compounds (such as SnS, SnSe, SnTe, PbS, PbSe, PbTe, and/or the like), ternary compounds (such as SnSeS, SnSeTe, SnSTe, PbSeS, PbSeTe, PbSTe, SnPbS, SnPbSe, SnPbTe, and/or the like), quaternary compounds (such as SnPbSSe, SnPbSeTe, SnPbSTe, and/or the like), or any combination thereof.

The Group IV element or compound may be a single-element compound (such as Si and/or Ge), a binary compound (such as SiC and/or SiGe), or any combination thereof.

Each element included in the multi-element compound, (e.g., the binary compound, the ternary compound, or the quaternary compound), may be present in the particles in a substantially uniform concentration (e.g., distribution) or a non-uniform concentration.

Meanwhile, the first quantum dots 451b may have a single structure or a core-shell dual structure, in which the concentration of each element included in the corresponding quantum dot is uniform. For example, a material included in the core and a material included in the shell may be different from each other.

The shell may serve as a protective layer for maintaining semiconductor properties by preventing or reducing chemical modification of the core and/or a charging layer for imparting electrophoretic properties to quantum dots. The shell may be a single layer or may include multiple layers. An interface between the core and the shell may have a concentration gradient that decreases toward the center of the concentration of elements present in the shell.

Non-limiting examples of the shell include metal or non-metal oxides, semiconductor compounds, or combinations thereof. Non-limiting examples of the metal or non-metal oxide include binary compounds (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like), ternary compounds (such as $MgAl_2O_4$, $CoFe_2O_4$, $NiFe_2O_4$, and/or $CoMn_2O_4$), or any combination thereof. The semiconductor compound may include a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A particle size of the first quantum dots 451b may have a full width at half maximum (FWHM) of an emission wavelength spectrum that is less than or equal to about 45 nm or less, for example, less than or equal to about 40 nm or less, and as another example, less than or equal to about 30 nm or less, and color purity or color reproducibility may be improved in this range. Because light emitted through the first quantum dots 451b is emitted in all directions, a viewing angle of light may improve.

In some embodiments, the shape of the first quantum dots 451b may be, for example, spherical, pyramidal, multi-arm, or cubic nanoparticles, nanotubes, nanowires, nanofibers, nanoplatelet particles, etc. In some embodiments, first scattering particles 451c may be further dispersed in the first photosensitive polymer 451a. The first scattering particles 451c may allow more first quantum dots 451b to be excited by scattering any portion of the blue incident light Lib that is not initially absorbed by the first quantum dots 451b. Therefore, the color conversion efficiency of the first color conversion layer 451 may be improved. In addition, the first scattering particles 451c may scatter light in various directions regardless of the incident angle, without substantially converting the wavelength of incident light. Through this, side visibility may be improved.

The first scattering particles 451c may be particles having a refractive index different from that of the first photosensitive polymer 451a, for example, light-scattering particles. The first scattering particles 451c are not particularly limited as long as they form an optical interface with the first photosensitive polymer 451a to partially scatter transmitted light, but may be, for example, metal oxide particles or organic particles. Non-limiting examples of the metal oxide include $TiO_2$, zirconium oxide ($ZrO_2$), aluminum oxide ($Al_2O_3$), $In_2O_3$, zinc oxide (ZnO), or tin oxide ($SnO_2$), and/or the like. Non-limiting examples of the organic material include acrylic resins and urethane resins. The second color conversion layer 452 may convert the blue incident light Lib into green light Lg. The second color conversion layer 452 may include a second photosensitive polymer 452a in which second quantum dots 452b are dispersed. In the second photosensitive polymer 452a, second scattering particles 452c are dispersed together with the second quantum dots 452b. Therefore, a color conversion rate of the second color conversion layer 452 may be increased.

The second photosensitive polymer 452a may include substantially the same material as the first photosensitive polymer 451a, and the second scattering particles 452c may include substantially the same material as the first scattering particles 451c.

The second quantum dots 452b may include (e.g., be of) substantially the same material as that of the first quantum dots 451b, and may have substantially the same shape as that of the first quantum dots 451b. However, a size of the second quantum dots 452b may be less (smaller) than a size of the first quantum dots 451b. Accordingly, the second quantum dots 452b may be to emit light having a wavelength band different from that of the first quantum dots 451b. For example, the energy band gap may be adjusted by adjusting the size of the quantum dot, and thus, light in various wavelength bands may be obtained. The second quantum dots 452b may be smaller than the first quantum dots 451b. Therefore, the second quantum dots 452b may be excited by the blue incident light Lib to isotropically emit the green light Lg having a wavelength longer than that of the blue light and shorter than that of the red light Lr. The light-transmitting layer 453 may include a third photosensitive polymer 453a in which the third scattering particles 453c are dispersed. For example, the light-transmitting layer 453 does not include separate quantum dots that may be excited by the blue incident light Lib. Similar to the first photosensitive polymer 451a, the third photosensitive polymer 453a may include an organic material having light transmission properties, and the third scattering particles 453c may include substantially the same material as that of the first scattering particles 451c. Because the blue incident light Lib incident onto the light-transmitting layer 453 may be transmitted through the light-transmitting layer 453 without color change, the light emitted through the light-transmitting layer 453 may be the blue light Lb. However, the blue incident light Lib may be scattered by the third scattering particles 453c in the light-transmitting layer 453 and emitted to the outside. Because the light-transmitting layer 453 transmits the blue incident light Lib without color change, higher light efficiency may be obtained.

FIG. 5A-5G (or 5A through 5G) are cross-sectional views illustrating some operations of a method of manufacturing a display apparatus according to an embodiment.

Figure 5A:
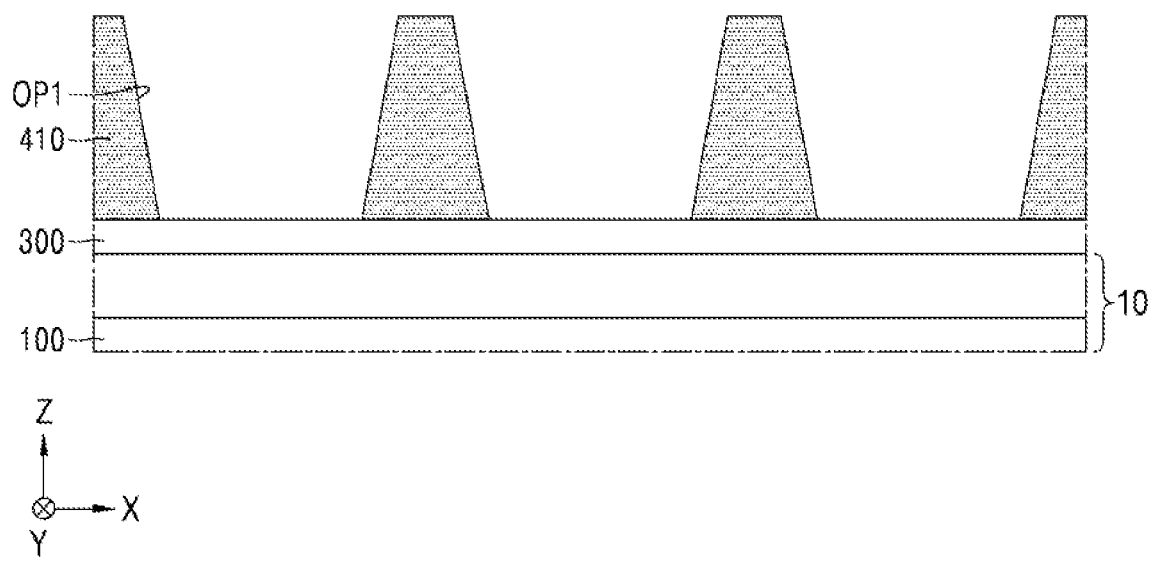

Referring to FIG. 5A, a light-emitting unit 10 including a substrate 100, a pixel circuit on the substrate 100, and a light-emitting device on the substrate 100 may be prepared. An encapsulation layer 300 may be formed above the light-emitting unit 10.

A first light-shielding layer 410 including first set of opening portions OP1 may be formed above the encapsulation layer 300. The first set of opening portions OP1 may correspond to light-emitting elements, respectively. For example, the first set of opening portions OP1 shown in FIG. 5A may respectively correspond to the $(1\text{-}1)^{st}$ opening portion OP1-1, the $(1\text{-}2)^{nd}$ opening portion OP1-2, and the $(1\text{-}3)^{rd}$ opening portion OP1-3 described above with reference to FIG. 3. For the formation of a first light-shielding layer 410, a photolithography process may be used as an example, and a nanoimprint lithography process may be used as another example.

Figure 5B:
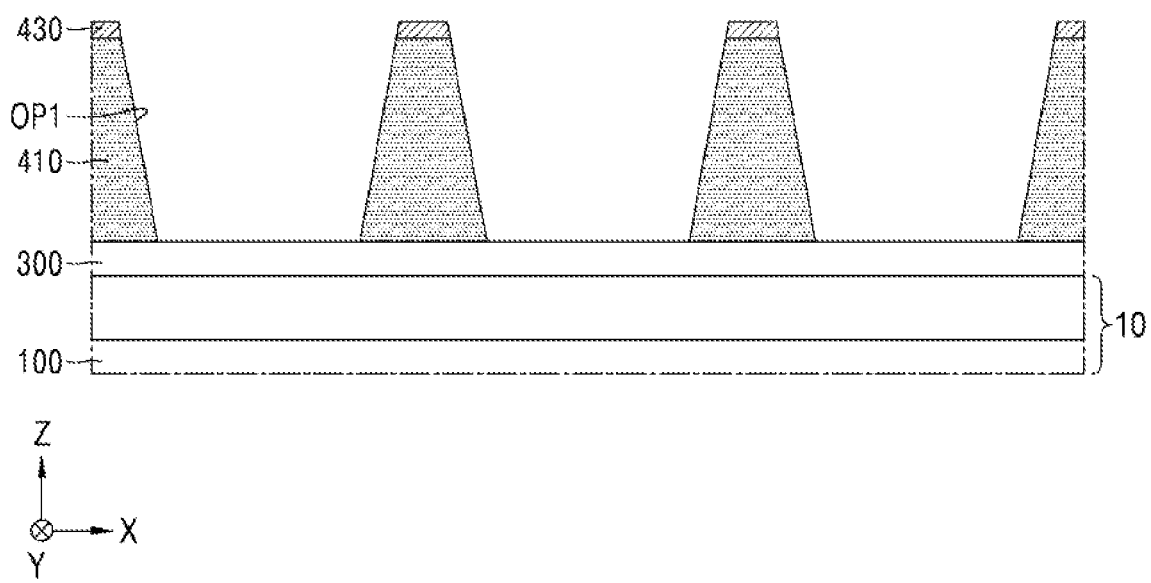

Referring to FIG. 5B, a liquid repellent layer 430 may be formed above the first light-shielding layer 410. The liquid repellent layer 430 may be formed by exposure during a photolithography process for forming the first light-shielding layer 410. For example, the first light-shielding layer 410 may be formed by exposing and developing a first material included in the first light-shielding layer 410, and the first material included in the first light-shielding layer 410 may include a liquid repellent material. In this case, the liquid repellent material mixed with the first material included in the first light-shielding layer 410 during exposure is collected on the upper surface of the first light-shielding layer 410 to form the liquid repellent layer 430. The liquid repellent material has liquid-repellent properties for the material forming the first color conversion layer 451, the second color conversion layer 452, and the light-transmitting layer 453, and may include an organic polymer material having hydrophobicity, such as an organic material including fluorine (F). Therefore, when the components of the first light-shielding layer 410 and the liquid repellent layer 430 completed through the above-described process are analyzed, a portion having a high content of organic matter including fluorine (F) may correspond to the liquid repellent layer 430.

Figure 5C:
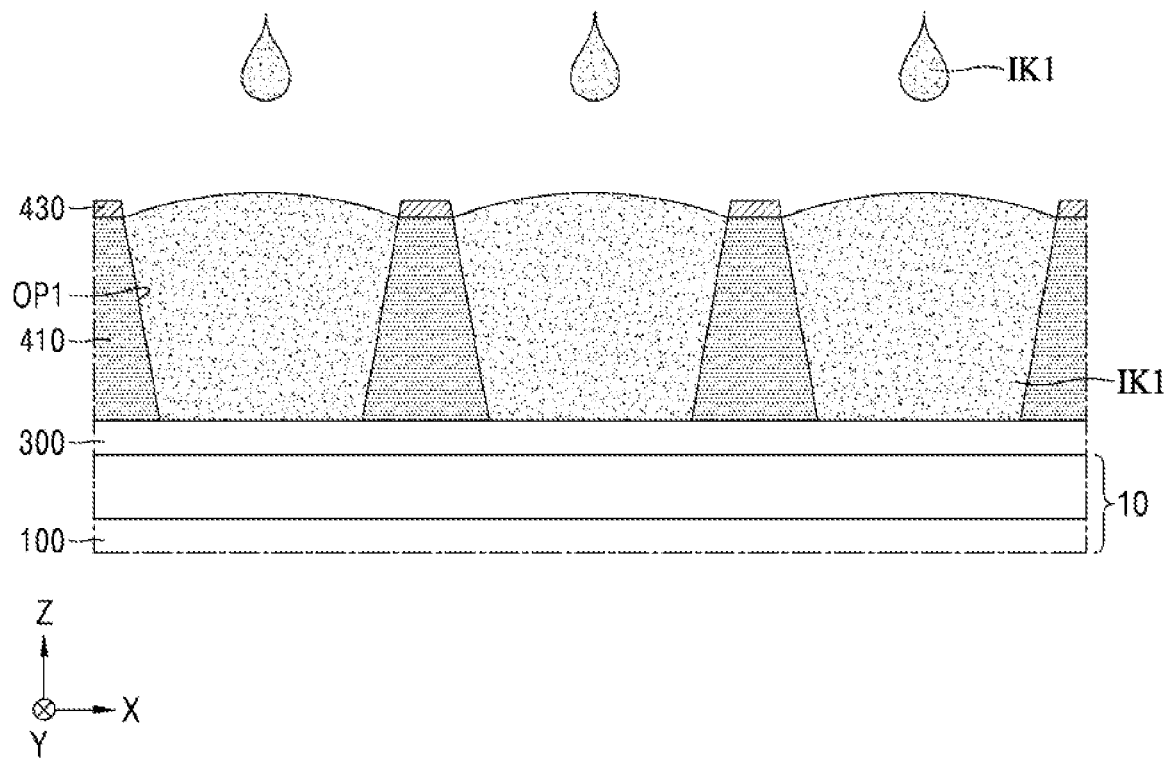

Referring to FIG. 5C, an inkjet printing process may be used to form the metal layer 440, and a first ink IK1 may be sprayed into the first set of opening portions OP1. The first ink IK1 may include a material for forming the metal layer 440. In an embodiment, the first ink IK1 may include $TiO_2$ and/or Ag nanoparticles, and may include a bifunctional monomer. For example, the first ink IK1 may include a mixture including $TiO_2$ and/or Ag nanoparticles and a bifunctional monomer. The mixture (e.g., the nanoparticles and the bifunctional monomer) may be less than 30 wt % based on the total amount of the first ink IK1. In another embodiment, the first ink IK1 may include a liquid crystalline monomer.

The first ink IK1 may include at least two solvents to dissolve the mixture. The at least two solvents may include a first solvent and a second solvent having different vapor pressures. The first solvent is a main solvent and may be 50 wt % or more based on the total amount of the first ink IK1 in an embodiment. The first solvent may be, for example, propylene glycol methyl ether acetate (PGMEA). The second solvent is a co-solvent and may help dissolve the mixture. The second solvent may be, for example, a ketone-based material, and may be acetone, methyl ethyl ketone (MEK), and/or the like.

In an embodiment, the first solvent may have a greater vapor pressure than the second solvent. Accordingly, an evaporation rate of the first solvent may be greater than that of the second solvent in a given drying environment.

Considering an area where the metal layer 440 will be formed on the inner surface of the first set of opening portions OP1, the first ink IK1 may be filled to a desired height in the first set of opening portions OP1 through the inkjet printing process.

Figure 5D:
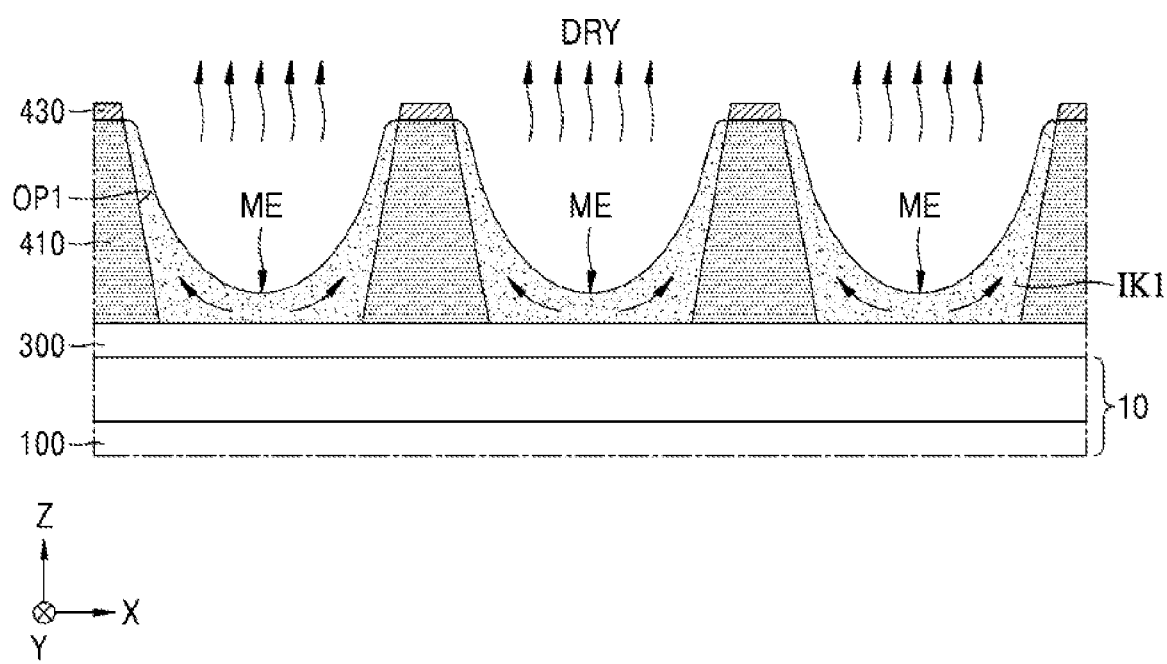

Referring to FIG. 5D, the first ink IK1 filled in the first set of opening portions OP1 may be dried. In an embodiment, the first ink IK1 may be dried under a temperature of room temperature or higher, for example, at 80° C., and a negative pressure may be formed around the first ink IK1 by sucking air around the first ink IK1 through an air inhaler and/or the like to promote drying.

The first solvent of the first ink IK1 has a higher vapor pressure than the second solvent, and thus, may be evaporated first. As the first solvent evaporates, the volume of the first ink IK1 in the first set of opening portions OP1 may decrease, and the first ink IK1 may form a concave meniscus (ME) by capillary action. The more the first solvent evaporates, the more concave the ME becomes, and the mixture that does not evaporate in the first ink IK1 (e.g., the $TiO_2$ or Ag nanoparticles, and the bifunctional monomer) may be driven to the inner surface of the first light-shielding layer 410. As the first solvent evaporates, the first ink IK1 may lose its fluidity, and thus, the first ink IK1 may maintain a concavity ME.

Figure 5E:
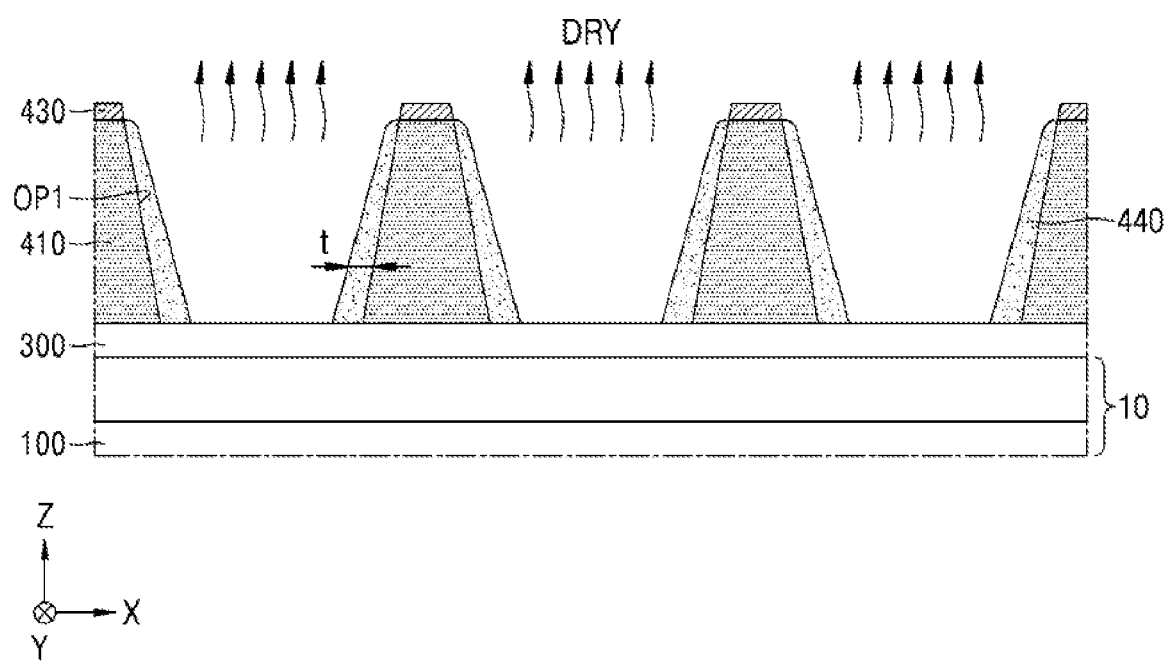

Referring to FIG. 5E, as the first ink IK1 is additionally dried, the second solvent of the first ink IK1 may be evaporated, and the volume of the first ink IK1 may thus be further reduced. In this process, the first ink IK1 completely loses its fluidity and may be cured. Some of the bifunctional monomers of the first ink IK1 may be condensed and polymerized to form a polymer. Therefore, after all the solvents of the first ink IK1 are evaporated, $TiO_2$ or Ag nanoparticles may be attached onto (e.g., adsorbed to) the inner surface of the first set of opening portions OP1 with the help of the polymer to form the metal layer 440. In this case, a width t of the metal layer 440 may increase as the metal layer 440 approaches the encapsulation layer 300.

Figure 5F:
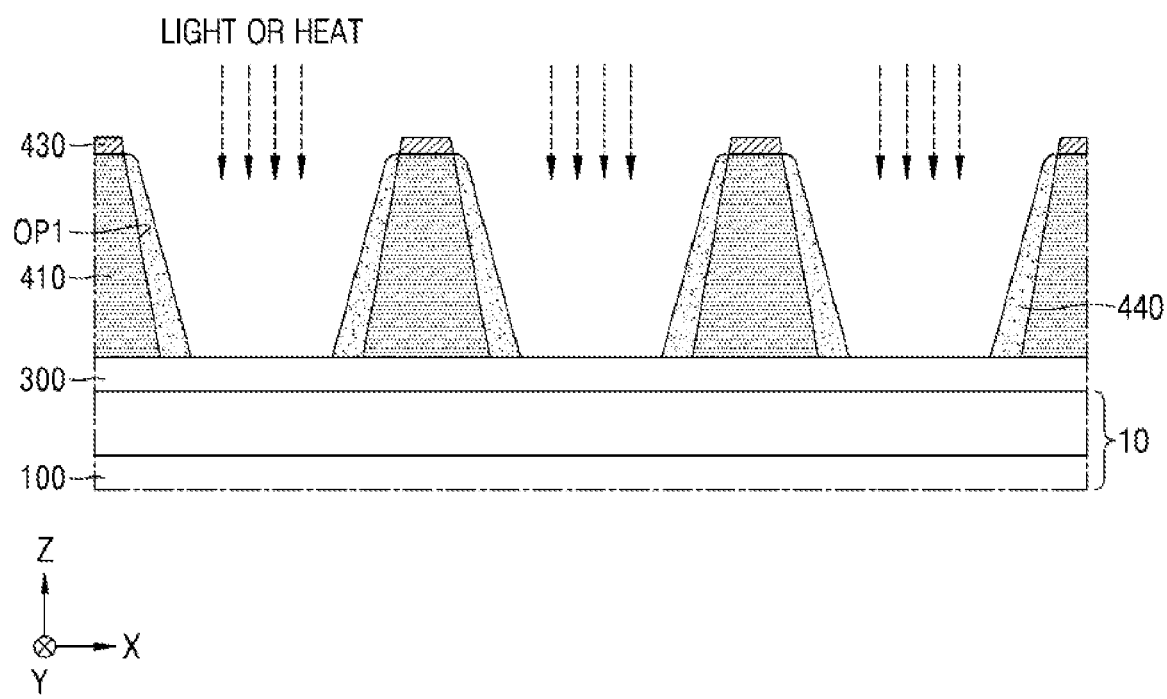

Referring to FIG. 5F, after the first ink IK1 is dried, a photocuring and/or thermal curing process may be performed. In an embodiment, a photocuring process may be performed by irradiating laser light and/or ultraviolet light to the metal layer 440. In addition, in an embodiment, a thermal curing process may be performed by applying heat to the metal layer 440, for example, heat of 120° C. or higher may be applied. The photocuring and/or thermal curing process may further accelerate the curing of the bifunctional monomers of the metal layer 440. Through this, the metal layer 440 may be formed more stably without collapsing on the inner surface of the first set of opening portions OP1.

Referring to FIG. 5G, a second ink IK2 may be sprayed into the first set of opening portions OP1 of the first light-shielding layer 410 through an inkjet printing process to form the first color conversion layer 451, the second color conversion layer 452, and the light-transmitting layer 453.

The second ink IK2 may include a $(2-1)^{st}$ ink IK2-1 including a material forming the first color conversion layer 451, a $(2-2)^{nd}$ ink IK2-2 including a material forming the second color conversion layer 452, and a $(2-3)^{rd}$ ink IK2-3 including a material forming the light-transmitting layer 453. The $(2-1)^{st}$ ink IK2-1 may include the first photosensitive polymer 451a (see FIG. 4), the first quantum dots 451b (see FIG. 4), the first scattering particles 451c described above with reference to FIG. 4. The $(2-2)^{nd}$ ink IK2-2 may include the second photosensitive polymer 452a (see FIG. 4), the second quantum dots 452b (see FIG. 4), and the second scattering particles 452c (see FIG. 4). The $(2-3)^{rd}$ ink IK2-3 may include the third photosensitive polymer 453a (see FIG. 4) and the third scattering particles 453c (see FIG. 4) that are described above with reference to FIG. 4.

As a comparative example, when a photolithography process or the like is used to form the metal layer 440, a process such as exposure and/or etching may be performed on the metal layer material above the liquid repellent layer to apply and pattern the metal layer material. In this process, the liquid repellent layer may be unintentionally removed, and overflow of the ink forming the color conversion layer or the light-transmitting layer may not be prevented.

However, according to the embodiment described above, because the inkjet printing process is used to form the metal layer 440, the liquid repellent layer 430 is not removed. Thus, overflow of ink may be prevented and manufacturing quality of the display apparatus may be improved.

Figure 6:
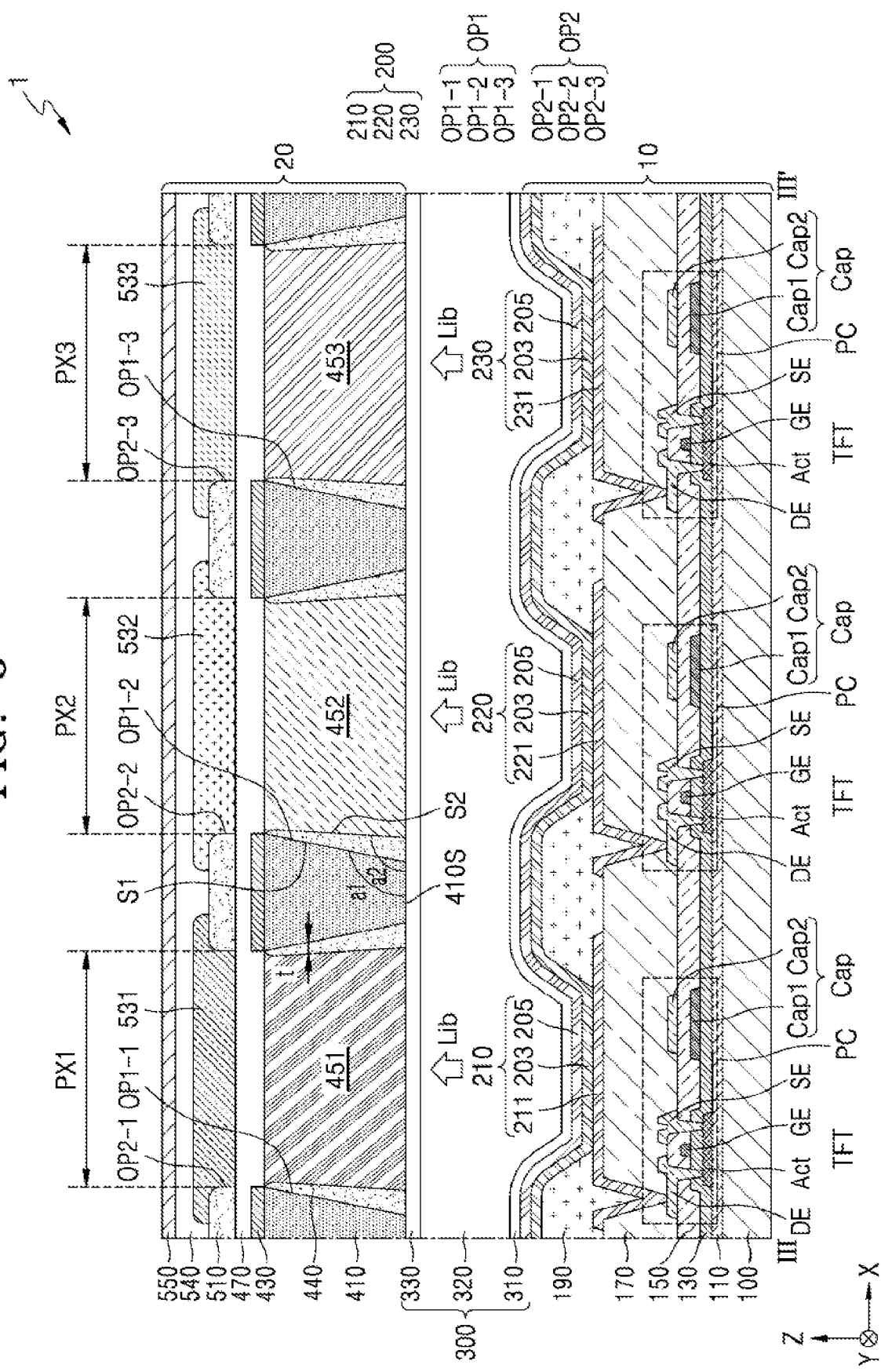
FIG. 6 is a cross-sectional view illustrating a portion of a display apparatus according to another embodiment.

FIG. 6 is a cross-sectional view illustrating a portion of a display apparatus 1 according to another embodiment.

The display apparatus 1 of FIG. 6 includes a light-emitting unit 10 and an optical unit 20 that converts or transmits light emitted from the light-emitting unit 10, and the structure of the light-emitting unit 10 is the same as the structure described above with reference to FIG. 3. The shape (e.g., internal structure) of the optical unit 20 of FIG. 6 is slightly different from that of the optical unit 20 described with reference to FIG. 3, and the following description will mainly focus on the differences.

Referring to FIG. 6, the first light-shielding layer 410 may include the first set of opening portions OP1, and the first light-shielding layer 410 defining the first set of opening portions OP1 may include inclined inner surfaces. For example, the inner surface of the first light-shielding layer 410 may include an inclined surface that is inversely tapered (e.g., oriented so that the inner surface inclines upward toward the center axis of the pixel), and the first angle a1 that the inner surface forms with respect to the lower surface 410S of the first light-shielding layer 410 may be an obtuse angle, that is, an angle greater than 90 degrees. The first light-shielding layer 410 may have an inverted trapezoidal cross-section, and the first opening portion OP1, for example, the $(1-1)^{st}$ opening portion OP1-1, the $(1-2)^{nd}$ opening portion OP1-2, and the $(1-3)^{rd}$ opening portion OP1-3 may gradually decrease in width in a direction away from the light-emitting unit 10 and/or the substrate 100. The shape of the first light-shielding layer 410 may be due to a change in the formation condition of the first light-shielding layer 410, such as a process temperature.

When the first angle a1 is an obtuse angle, the possibility that wavelengths of incident light Lib incident into the first set of opening portions OP1 are reflected back toward the substrate 100 from the inner surface of the first light-shielding layer 410 may increase. However, according to an embodiment, the width t of the metal layer 440 on the inner surface of the first light-shielding layer 410 increases as the metal layer 440 approaches the encapsulation layer 300, and thus, the second angle a2 may be less than the first angle a1. Having the metal layer 440 as described above allows pieces of incident light Lib to be reflected off the second surface S2 of the metal layer 440 and reduces the likelihood that the pieces of light Lib are reflected back toward the substrate 100. Through this, optical loss may be reduced.

Figure 7A:
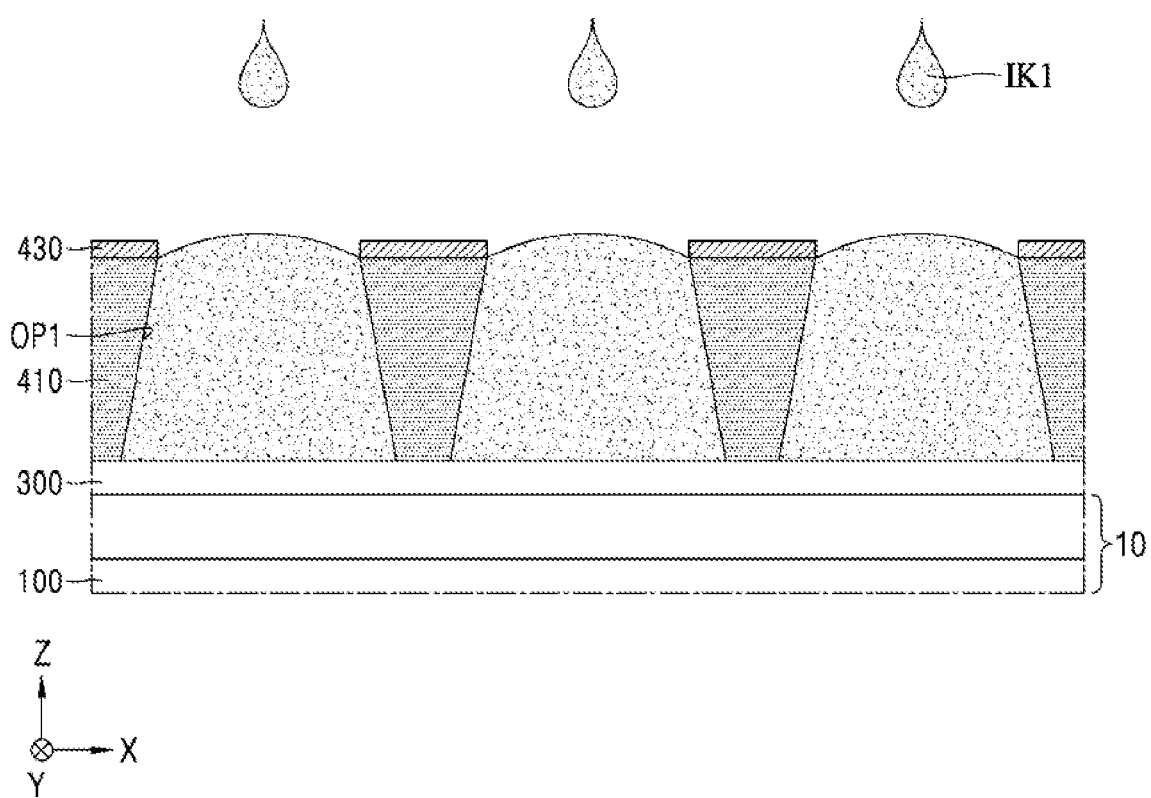
FIGS. 7A-7C are cross-sectional views illustrating some operations of a method of manufacturing a display apparatus according to another embodiment.
Figure 7B:
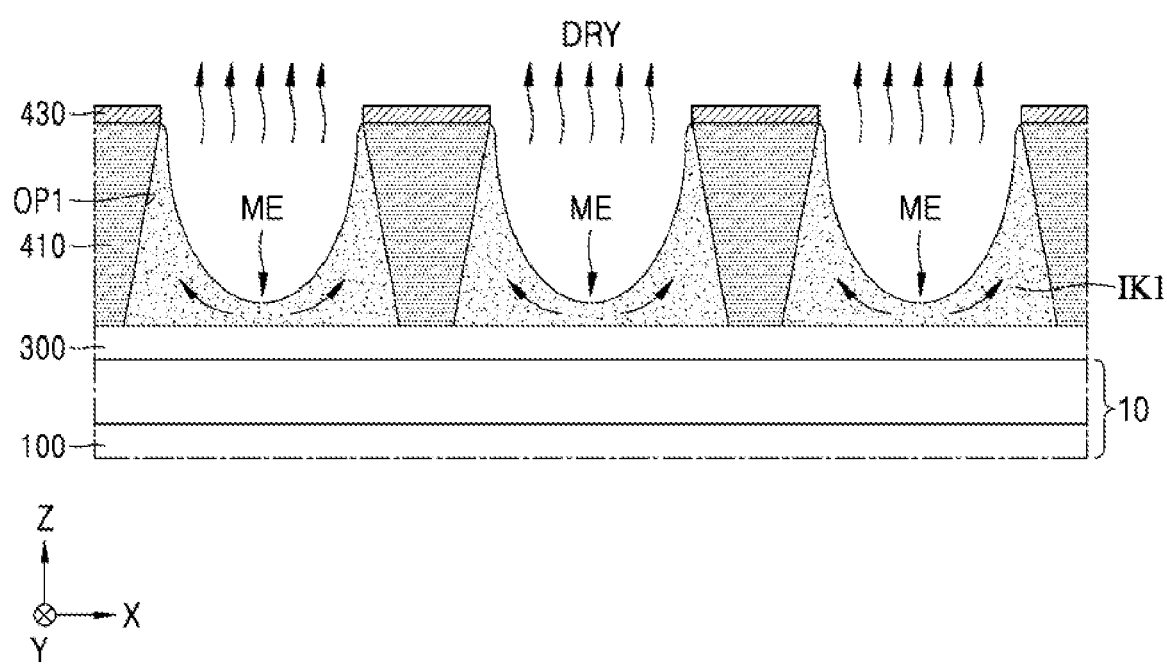
Figure 7C:
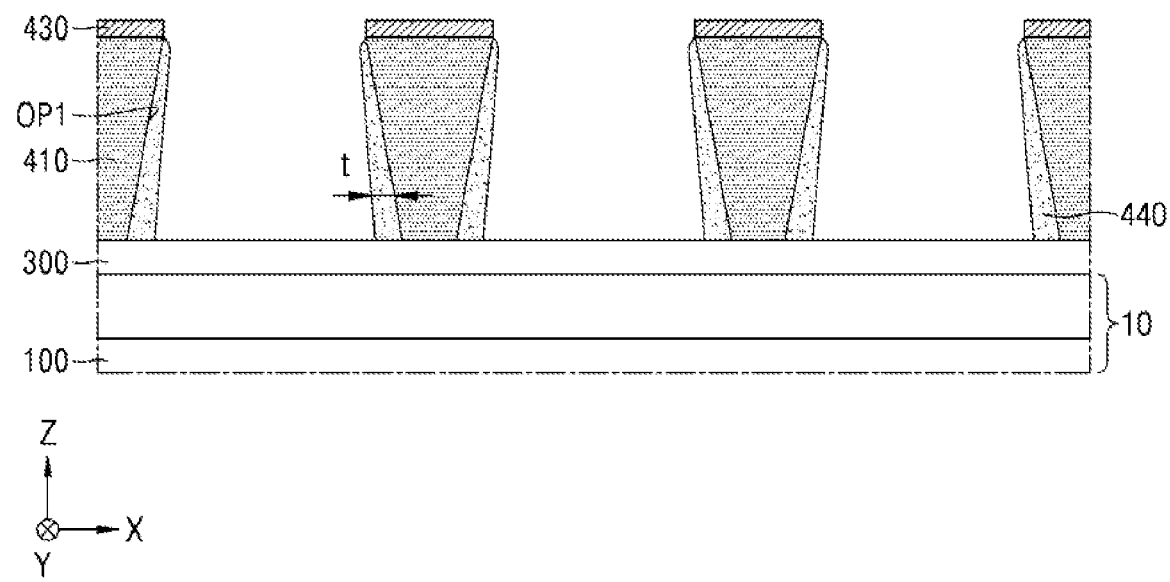

FIGS. 7A-7C are cross-sectional views illustrating some tasks of a method of manufacturing a display apparatus according to another embodiment and some tasks of the method of manufacturing the display apparatus of FIG. 6.

Referring to FIG. 7A, a first light-shielding layer 410 including the first set of opening portions OP1, and a liquid repellent layer 430 may be formed. A process of forming the first light-shielding layer 410 and the liquid repellent layer 430 is as described above with reference to FIGS. 5A and 5B.

Then, to form the metal layer 440, and a first ink IK1 may be sprayed into the first set of opening portions OP1 through an inkjet printing process.

Referring to FIG. 7B, the first ink IK1 filled in the first set of opening portions OP1 may be dried. As a first solvent of the first ink IK1 evaporates, the volume of the first ink IK1 in the first set of opening portions OP1 may decrease, and the first ink IK1 may form a concave ME by capillary action. The more the first solvent evaporates, the more concave the ME becomes, and the mixture that does not evaporate in the first ink IK1, i.e., $TiO_2$ or Ag nanoparticles, and bifunctional monomer may be driven to the inner surface of the first light-shielding layer 410.

Referring to FIG. 7C, as the first ink IK1 is additionally dried, a second solvent of the first ink IK1 may be evaporated, and when all solvents in the first ink IK1 are evaporated, the first ink IK1 completely loses its fluidity and may be cured. $TiO_2$ and/or Ag nanoparticles of the first ink IK1 may be attached onto the inner surface of the first set of opening portions OP1 with the help of a polymer formed by condensation and polymerization of bifunctional monomers to form the metal layer 440. In this case, a width t of the metal layer 440 may increase as the metal layer 440 approaches the encapsulation layer 300.

After the first ink IK1 is dried, a photocuring and/or thermal curing process may be performed, and a method for this may be as described above with reference to FIG. 5F. In addition, after the metal layer 440 is formed, a first color conversion layer 451, a second color conversion layer 452, and a light-transmitting layer 453 may be formed, and a method thereof is as described above with reference to FIG. 5G.

According to an embodiment configured as described above, a metal layer for scattering and reflecting light may be formed around the color conversion layer and the light conversion layer without damaging the liquid repellent layer for preventing or reducing color mixing between pixels. Through this, color mixture may be prevented or reduced, and luminance and/or light conversion efficiency may be improved. Thus, a display apparatus having improved display quality and a method of manufacturing the display apparatus may be implemented. However, the disclosure is not limited by such an effect.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic or electric devices and/or any other relevant devices or components according to embodiments of the present disclosure described herein, such as, for example, a timing controller, a data driver, and a gate driver, may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing/electronic devices may be combined or integrated into a single computing/electronic device, or the functionality of a particular computing/electronic device may be distributed across one or more other computing/electronic devices without departing from the spirit and scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A display apparatus comprising:
   a first light-emitting element, a second light-emitting element, and a third light-emitting element, each comprising an emission layer to emit light of a first color in a first direction;
   an encapsulation layer covering the first to third light-emitting elements;
   a first light-shielding layer on the encapsulation layer, the first light-shielding layer comprising a first set of opening portions respectively corresponding to the first to third light-emitting elements;
   a metal layer on an inner surface of the first light-shielding layer, the inner surface defining the first set of opening portions,
   wherein:

a width of the metal layer in a second direction normal to the first direction gradually decreases along the first direction;

a first color conversion layer arranged in a first opening portion of the first set of opening portions, and corresponding to the first light-emitting element;

a second color conversion layer arranged in a second opening portion of the first set of opening portions, and corresponding to the second light-emitting element; and a light-transmitting layer arranged in a third opening portion of the first set of opening portions, and corresponding to the third light-emitting element.

2. The display apparatus of claim 1, further comprising a liquid repellent layer on the first light-shielding layer between the first, second, and third opening portions of the first set of opening portions on a plane.

3. The display apparatus of claim 1, wherein the width of the metal layer is less than about 2 μm.

4. The display apparatus of claim 1, wherein the metal layer comprises titanium oxide ($TiO_2$) and/or silver (Ag) nanoparticles.

5. The display apparatus of claim 1, wherein the metal layer comprises a polymer.

6. The display apparatus of claim 5, wherein the polymer of the metal layer comprises a condensation polymer of a bifunctional monomer.

7. The display apparatus of claim 6, wherein the bifunctional monomer comprises hexanediol diacrylate (1,6 hexanediol diacrylate, HDDA).

8. The display apparatus of claim 1, further comprising a second light-shielding layer on the first light-shielding layer, the second light-shielding layer comprising a second set of opening portions overlapping the first set of opening portions.

9. The display apparatus of claim 8, further comprising a first color filter layer, a second color filter layer, and a third color filter layer, each arranged in the second set of opening portions and overlapping the first color conversion layer, the second color conversion layer, and the light-transmitting layer, respectively.

10. The display apparatus of claim 1, wherein the inner surface of the first light-shielding layer is a tapered inclined surface.

11. The display apparatus of claim 1, wherein the metal layer comprises a first surface in contact with the inner surface of the first light-shielding layer, and a second surface opposite the first surface, and wherein a first angle is greater than a second angle, the first angle being formed by a lower surface of the first light-shielding layer facing the encapsulation layer and the first surface of the metal layer, and the second angle being formed by the lower surface of the first light-shielding layer and the second surface of the metal layer.

12. A method of manufacturing a display apparatus, the method comprising:

preparing a substrate on which a first light-emitting element, a second light-emitting element, and a third light-emitting element are arranged, the first light-emitting element, the second light-emitting element, and the third light-emitting element each comprising an emission layer of a first color;

forming, on the substrate, a first light-shielding layer comprising a first set of opening portions corresponding to the first to third light-emitting elements, respectively;

forming a liquid repellent layer on the first light-shielding layer;

spraying a first ink into the first set of opening portions, the first ink comprising at least two solvents; and drying the first ink to form a metal layer in the first set of opening portions.

13. The method of claim 12, wherein the at least two solvents of the first ink comprise first and second solvents having different vapor pressures from each other.

14. The method of claim 13, wherein the first ink comprises 50 wt % or more of the first solvent.

15. The method of claim 14, wherein the first solvent has a greater vapor pressure than the second solvent.

16. The method of claim 15, wherein the drying of the first ink comprises:

evaporating the first solvent; and evaporating the second solvent.

17. The method of claim 12, wherein the first ink comprises a mixture of titanium oxide ($TiO_2$) and/or silver (Ag) nanoparticles, and a bifunctional monomer.

18. The method of claim 17, wherein the mixture is less than 30 wt % of the first ink.

19. The method of claim 17, wherein the bifunctional monomer comprises hexanediol diacrylate (1,6 hexanediol diacrylate, HDDA).

20. The method of claim 12, further comprising performing a photocuring and/or thermal curing process after the drying of the first ink.

21. The method of claim 12, further comprising spraying a second ink into the first set of opening portions, the second ink comprising scattering particles and quantum dots.

* * * * *